United States Patent
Matsuda et al.

(10) Patent No.: US 11,180,598 B2
(45) Date of Patent: Nov. 23, 2021

(54) ULTRAVIOLET CURABLE ORGANOPOLYSILOXANE COMPOSITION, SILICONE GEL CURED PRODUCT AND METHOD FOR PRODUCING SAME, AND PRESSURE SENSOR

(71) Applicant: SHIN-ETSU CHEMICAL CO., LTD., Tokyo (JP)

(72) Inventors: Tsuyoshi Matsuda, Annaka (JP); Takafumi Sakamoto, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 16/956,211

(22) PCT Filed: Nov. 28, 2018

(86) PCT No.: PCT/JP2018/043727
§ 371 (c)(1),
(2) Date: Jun. 19, 2020

(87) PCT Pub. No.: WO2019/130960
PCT Pub. Date: Jul. 4, 2019

(65) Prior Publication Data
US 2021/0070912 A1 Mar. 11, 2021

(30) Foreign Application Priority Data
Dec. 28, 2017 (JP) .............................. JP2017-252801

(51) Int. Cl.
| | | |
|---|---|---|
| C08F 2/46 | (2006.01) | |
| C08F 2/50 | (2006.01) | |
| C08G 61/04 | (2006.01) | |
| C08F 299/08 | (2006.01) | |
| C08F 2/48 | (2006.01) | |
| G01L 9/00 | (2006.01) | |

(52) U.S. Cl.
CPC .............. *C08F 299/08* (2013.01); *C08F 2/48* (2013.01); *G01L 9/00* (2013.01)

(58) Field of Classification Search
CPC . C08F 299/08; C08F 2/48; C08F 2/50; C08G 61/04; G01L 9/00
USPC ............................................ 522/99, 1; 520/1
See application file for complete search history.

(56) References Cited

U.S. PATENT DOCUMENTS

| | | |
|---|---|---|
| 4,910,232 A | 3/1990 | Arai |
| 2008/0176086 A1 | 7/2008 | Irifune |
| 2015/0166458 A1 | 6/2015 | Hase et al. |
| 2016/0075869 A1 | 3/2016 | Matsuda |

FOREIGN PATENT DOCUMENTS

| | | |
|---|---|---|
| JP | 60-118712 A | 6/1985 |
| JP | 62-212415 A | 9/1987 |
| JP | 6-17435 A | 1/1994 |
| JP | 9-77951 A | 3/1997 |

(Continued)

OTHER PUBLICATIONS

Kozai et al, Machine Translation, Aug. 23, 2007 (Year: 2007).*

(Continued)

*Primary Examiner* — Jessica Whiteley
(74) *Attorney, Agent, or Firm* — Birch, Stewart, Kolasch & Birch, LLP

(57) ABSTRACT

An ultraviolet curable organopolysiloxane composition which contains:
(A) a linear or branched organopolysiloxane which contains, as monovalent substituents bonded to a silicon atom at an end of the molecular chain, at least three groups represented by formula (1) and/or formula (2) in each molecule, while having the main chain composed of repeated diorganosiloxane units

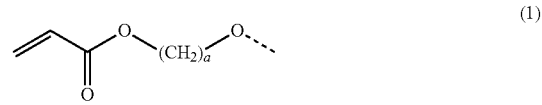

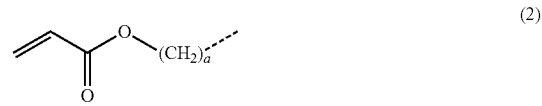

(in the formulae, a represents a number of 1-3; and the broken line represents a bonding hand);
(B) a linear or branched organopolysiloxane which contains at least two groups represented by formula (3) in each molecule, while having the main chain composed of repeated diorganosiloxane units

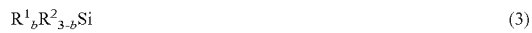

(in the formula, $R^1$ represents an alkenyl group; $R^2$ represents a monovalent hydrocarbon group; and b represents a number of 1-3); and
(C) a photoinitiator.
With use of this ultraviolet curable organopolysiloxane composition, the hardness of a cured product obtained therefrom is easily controlled, and good surface curability and good curability in deep portions are achieved even in the presence of oxygen. Consequently, this ultraviolet curable organopolysiloxane composition enables the achievement of a silicone gel (a gel-like cured product) which has been cured at a substantially uniform crosslinking density (with a substantially uniform penetration) without depending on the irradiance of ultraviolet light (the amount of irradiation energy).

8 Claims, No Drawings

(56) References Cited

FOREIGN PATENT DOCUMENTS

| | | |
|---|---|---|
| JP | 2001-64593 A | 3/2001 |
| JP | 2005-40749 A | 2/2005 |
| JP | 2005-144923 A | 6/2005 |
| JP | 3894873 B2 | 3/2007 |
| JP | 2007-214543 A | 8/2007 |
| JP | 2007214543 * | 8/2007 |
| JP | 2008-195931 A | 8/2008 |
| JP | 2013-253166 A | 12/2013 |
| JP | 2016-56330 A | 4/2016 |
| JP | 2017-179083 A | 10/2017 |
| WO | WO 2009/044885 A1 | 4/2009 |

OTHER PUBLICATIONS

International Search Report, issued in PCT/JP2018/043727, PCT/ISA/210, dated Feb. 26, 2019.
Written Opinion of the International Searching Authority, issued in PCT/JP2018/043727, PCT/ISA/210, dated Feb. 26, 2019.

* cited by examiner

ULTRAVIOLET CURABLE ORGANOPOLYSILOXANE COMPOSITION, SILICONE GEL CURED PRODUCT AND METHOD FOR PRODUCING SAME, AND PRESSURE SENSOR

TECHNICAL FIELD

This invention relates to an ultraviolet-curable organopolysiloxane composition which is effectively curable with a wide range of UV illuminance and good in surface cure and depth cure and facilitates to adjust the hardness of a cured product, and more particularly, to a UV-curable organopolysiloxane composition which upon UV irradiation, is improved in reducing oxygen inhibition and consistently cures even in the presence of oxygen into a silicone gel (gel-like cured product) having a substantially constant crosslinking density (substantially constant penetration), independently of the UV dose (irradiation energy amount); a silicone gel cured product obtained by curing the composition, a method for producing the cured product, and a pressure sensor comprising the cured product.

BACKGROUND ART

The efforts to enable simplification and cost reduction of manufacturing processes, collaborated with the trend toward energy saving from environmental considerations, are positively made in a variety of fields. In particular, most of the processes for manufacturing optical, electric and electronic devices and displays involve the step of heating at high temperature for curing of bonding, encapsulating and embedding materials, the heating step requiring enormous energy, time and equipment. There is the desire for improvement. An improvement in the heating step not only contributes to the energy and cost, but is also important in the technical sense that other members are not damaged.

To solve the outstanding problems, a focus is recently drawn to UV-curable compositions. The UV-curable compositions contain photoinitiators which are activated upon UV irradiation, whereby polymerization or crosslinking reaction takes place. Curing is completed within a time as short as several tens of seconds to ten-odd minutes. This avoids any damage to other members and large equipment is no longer needed. Nowadays UV irradiation units utilizing LED are developed. The manufacturing process is regarded superior.

For the curing of UV-curable silicone compositions, there are proposed methods using photo-induced cationic polymerization and radical polymerization. As the former method, Patent Document 1: JP-A 2008-195931 discloses a composition containing an onium salt capable of generating an acid upon UV irradiation. When this composition is applied to electric/electronic substrates, for example, there is concern that the substrates can be corroded. The latter method is characterized in that the reaction rate is high due to high reactivity and cure is complete in a short time. On use of reactive compounds, typically acrylic compounds in the radical polymerization reaction, rubber having a high cured hardness is obtained, but some modification is necessary in order to obtain a gel-like cured product having a low hardness.

Patent Document 2: JP-B H06-017435 and Patent Document 3: JP 3894873 propose methods for obtaining silicone gel cured products after UV irradiation. These methods, however, are difficult to adjust the cured products to the desired hardness or penetration, and the hardness or penetration largely depends on the dose of UV irradiation. In addition, radicals have an extremely short life and can be readily deactivated with oxygen or the like. The cure rate at the surface of the composition in contact with air can be significantly retarded depending on the hardness or penetration.

In conjunction with the cure inhibition problem, various sensitizers are considered as an additive, for example, in Patent Document 4: JP-A 2001-064593, Patent Document 5: JP-A 2005-040749, and Patent Document 6: JP-A 2013-253166.

The method of Patent Document 4 uses a certain amine compound as the additive to impart basicity for enhancing the reactivity of a photoinitiator or (meth)acrylate double bond. In the method of Patent Document 5, an anthracene or xanthone derivative having a high molecular extinction coefficient over a wide range of wavelength is co-present so that higher excitation energy is released from irradiating light.

Also in the method of Patent Document 6, a (meth)acrylate resulting from an alcohol having at least one hydroxyl group and at least two oxygen atoms in the molecule is used as a cure sensitizer to enhance polymerization reactivity.

PRIOR ART DOCUMENTS

Patent Documents

Patent Document 1: JP-A 2008-195931
Patent Document 2: JP-B H06-017435
Patent Document 3: JP 3894873
Patent Document 4: JP-A 2001-064593
Patent Document 5: JP-A 2005-040749
Patent Document 6: JP-A 2013-253166

SUMMARY OF INVENTION

Technical Problem

An object of the invention, which has been made under the above-mentioned circumstances, is to provide a UV-curable organopolysiloxane composition which is effectively curable with a wide range of UV illuminance and good in surface cure and depth cure and facilitates to adjust the hardness of a cured product, and more particularly, a UV-curable organopolysiloxane composition which upon UV irradiation, is improved in reducing oxygen inhibition and consistently cures even in the presence of oxygen into a silicone gel (gel-like cured product) having a substantially constant crosslinking density (substantially constant penetration), independently of the UV dose (irradiation energy amount); a silicone gel cured product obtained by curing the composition, a method for producing the cured product, and a pressure sensor comprising the cured product.

As used herein, the "silicone gel cured product" (silicone gel in the form of the cured product of an organopolysiloxane composition) refers to a cured product which is mainly composed of an organopolysiloxane, has a low crosslinking density, and exhibits a penetration of 10 to 200 according to JIS K2220 (¼ cone). The cured product is equivalent to one having a rubber hardness of 0 by rubber hardness measurement according to JIS K6253 and hence, a hardness as low as not to exhibit an effective rubber hardness (i.e., is soft), a low crosslinking density, and a low modulus.

In this respect, the silicone gel cured product is distinguished from typical silicone rubber cured products, i.e., rubber-like elastomers.

Solution to Problem

Making extensive investigations to attain the above object, the inventors have found that when a UV-curable organopolysiloxane composition uses a linear or branched organopolysiloxane based on a backbone composed of repeating diorganosiloxane units and having at least three acryloxyalkyloxy or acryloxyalkyl groups of the general formula (1) and/or (2), defined below, per molecule, as a monovalent substituent bonded to the silicon atom at the end of the molecular chain, as a reactive base, and a linear or branched organopolysiloxane based on a backbone composed of repeating diorganosiloxane units and having at least two $C_2$-$C_6$ alkenyl-containing groups of the general formula (3), defined below, per molecule, preferably at ends of the molecular chain, as a plasticizer, the hardness of a cured product is readily adjustable, surface cure and depth cure are good even in the presence of oxygen, and a silicone gel (gel-like cured product) having a substantially constant crosslinking density or substantially constant penetration is obtained independently of the UV dose (irradiation energy amount). The invention is predicated on this finding.

Accordingly, the invention provides a UV-curable organopolysiloxane composition, a silicone gel cured product obtained by curing the composition, a method for producing the cured product, and a pressure sensor comprising the cured product, as defined below.

[1]
A UV-curable organopolysiloxane composition comprising:

(A) 5 to 70 parts by weight of a linear or branched organopolysiloxane based on a backbone composed of repeating diorganosiloxane units and having at least three groups of the general formula (1) and/or (2) per molecule, as a monovalent substituent bonded to the silicon atom at the end of the molecular chain,

[Chem. 1]

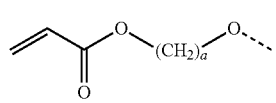

(1)

wherein "a" is an integer of 1 to 3, and the broken line denotes a valence bond,

[Chem. 2]

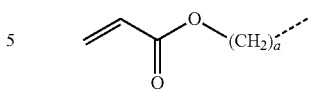

(2)

wherein "a" is as defined above, and the broken line denotes a valence bond, (B) 30 to 95 parts by weight of a linear or branched organopolysiloxane based on a backbone composed of repeating diorganosiloxane units and having at least two groups of the general formula (3) per molecule,

[Chem. 3]

$R^1{}_b R^2{}_{3-b} Si$ (3)

wherein $R^1$ is a $C_2$-$C_6$ alkenyl group, $R^2$ is a $C_1$-$C_{10}$ substituted or unsubstituted monovalent hydrocarbon group, b is an integer of 1 to 3, and the broken line denotes a valence bond, the total of components (A) and (B) being 100 parts by weight, and (C) 0.01 to 15 parts by weight of a photoinitiator.

[2]
The UV-curable organopolysiloxane composition of [1] wherein component (A) is a linear or branched organopolysiloxane having one or two groups of the general formula (1) and/or (2) on each of the silicon atoms at the ends of the molecular chain independently, the total number of said groups being at least three per molecule, and component (B) is a linear or branched organopolysiloxane blocked at the end of the molecular chain with a group of the general formula (3).

[3]
The UV-curable organopolysiloxane composition of [1] or [2] wherein component (A) is an organopolysiloxane having the general formula (4) and/or (5):

[Chem. 4]

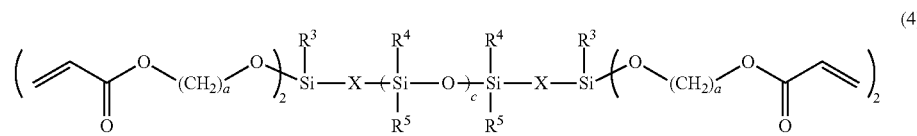

(4)

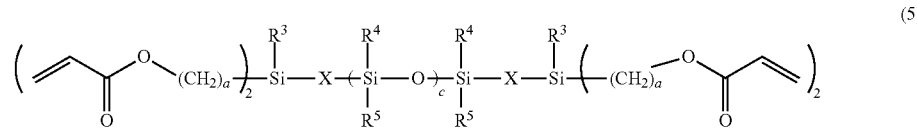

(5)

wherein "a" is an integer of 1 to 3, X is a $C_2$-$C_6$ alkylene group, $R^3$, $R^4$, and $R^5$ are each independently a $C_1$-$C_{12}$ substituted or unsubstituted monovalent hydrocarbon group, and c is such a number that the organopolysiloxane may have a viscosity of 100 to 500,000 mPa·s.

[4]
A method for preparing a silicone gel cured product, comprising the step of irradiating UV radiation to the UV-curable organopolysiloxane composition of any one of [1] to [3], the cured product having a penetration of 10 to 130 according to JIS K2220.

[5]
A silicone gel cured product obtained by curing the UV-curable organopolysiloxane composition of any one of [1] to [3], the cured product having a penetration of 10 to 130 according to JIS K2220 and a volume resistivity of at least 1 TΩ·m according to JIS K6271 at an applied voltage of 500 V.

[6]

A pressure sensor comprising the silicone gel cured product of [5].

Advantageous Effects of Invention

The UV-curable organopolysiloxane composition of the invention is advantageous in that the hardness of a cured product resulting therefrom is readily adjustable, the composition is effectively curable with a wide range of UV illuminance, good in surface cure and depth cure even in air atmosphere, and resistant to oxygen inhibition. The composition is significantly improved in workability over prior art UV-curable silicone compositions.

DESCRIPTION OF EMBODIMENTS

Now the invention is described in detail.
[Component (A)]

Component (A) is a base polymer of the inventive composition, a curable component adapted to crosslink upon UV irradiation, and specifically a linear or branched organopolysiloxane based on a backbone composed of repeating diorganosiloxane units and having per molecule at least three groups of the general formula (1) and/or (2):

[Chem. 5]

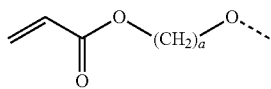  (1)

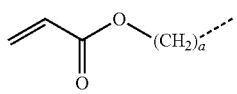  (2)

wherein "a" is an integer of 1 to 3, and the broken line denotes a valence bond, as a monovalent substituent bonded to the silicon atom at the end of the molecular chain, preferably 3 to 6 groups, more preferably 3 or 4 groups, most preferably 4 groups of formula (1) and/or (2) (i.e., two groups on each of the silicon atoms at both ends of the molecular chain). Preferably it is a linear or branched organopolysiloxane having one or two groups of formula (1) and/or (2) on each of the silicon atoms at the ends of the molecular chain independently, the total number of said groups being at least 3, typically 3 or 4 per molecule, and more preferably two groups of formula (1) and/or (2) on each of the silicon atoms at both ends of the molecular chain.

In formulae (1) and (2), "a" is an integer of 1, 2 or 3, preferably 2 or 3.

In the molecule of the organopolysiloxane as component (A) based on the backbone composed of repeating diorganosiloxane units, examples of an organic group bonded to a silicon atom in each diorganosiloxane unit (referred to as "silicon-bonded organic group," hereinafter) include substituted or unsubstituted, monovalent hydrocarbon groups of typically 1 to 12 carbon atoms, preferably 1 to 10 carbon atoms, more preferably 1 to 8 carbon atoms, preferably free of aliphatic unsaturation. Suitable unsubstituted monovalent hydrocarbon groups include alkyl groups such as methyl, ethyl, propyl, isopropyl, butyl, isobutyl, sec-butyl, tert-butyl, hexyl, cyclohexyl, octyl, 2-ethylhexyl and decyl; alkenyl groups such as vinyl, allyl, propenyl, isopropenyl, and butenyl; aryl groups such as phenyl, tolyl, xylyl and naphthyl; and aralkyl groups such as benzyl, phenylethyl and phenylpropyl. Suitable substituted monovalent hydrocarbon groups include halo or cyano-substituted forms of the foregoing unsubstituted monovalent hydrocarbon groups in which some or all of the carbon-bonded hydrogen atoms are substituted by halogen, such as chloromethyl, bromoethyl, and trifluoropropyl, or by cyano, such as cyanoethyl. For ease of synthesis, alkyl, aryl and haloalkyl groups are preferred, and methyl, phenyl and trifluoropropyl are more preferred.

The molecular structure of component (A) is basically a linear or branched structure (inclusive of a partially branched linear structure) whose backbone is composed of repeating diorganosiloxane units, preferably a linear diorganopolysiloxane which is blocked at both ends of the molecular chain with groups of formula (1) and/or (2). Component (A) may be a homopolymer having such a molecular structure, a copolymer having such molecular structures, or a mixture of two or more of these polymers.

Component (A) should preferably have a viscosity at 25° C. in the range of 100 to 500,000 mPa·s, especially 300 to 100,000 mPa·s, within which the composition is easier to work and the cured product has better dynamic properties. As used herein, the viscosity is measured by a rotational viscometer, for example, BL, BH, BS or cone-plate type viscometer or rheometer. In the case of linear organopolysiloxane, the above range of viscosity generally corresponds to a number average degree of polymerization of about 50 to 2,000, preferably about 100 to 1,500. It is noted that the degree of polymerization or molecular weight may be determined, for example, as a number average degree of polymerization or number average molecular weight by gel permeation chromatography (GPC) versus polystyrene standards using toluene as developing solvent.

Specific examples of component (A) include organopolysiloxanes having the general formulae (4) and (5).

[Chem. 6]

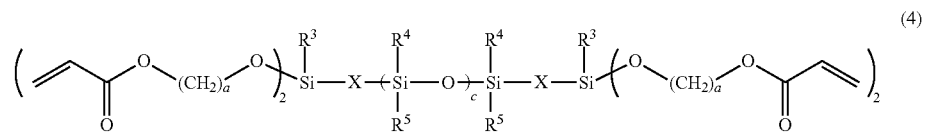  (4)

-continued

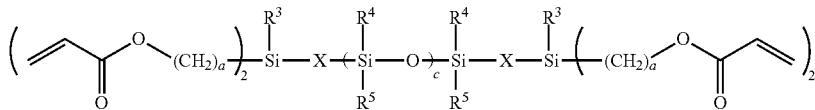

(5)

Herein "a" is as defined above, X is a $C_2$-$C_6$ alkylene group, $R^3$, $R^4$, and $R^5$ are each independently a substituted or unsubstituted monovalent hydrocarbon group of 1 to 12 carbon atoms, preferably 1 to 10 carbon atoms, preferably free of aliphatic unsaturation, and c is such a number that the organopolysiloxane may have a viscosity in the above range.

In formulae (4) and (5), examples of the monovalent hydrocarbon group represented by $R^3$, $R^4$, and $R^5$ are as exemplified above for the substituted or unsubstituted monovalent hydrocarbon group as the silicon-bonded organic group, exclusive of aliphatically unsaturated groups (alkenyl groups), preferably include alkyl, cycloalkyl, aryl, aralkyl and haloalkyl groups, with methyl and phenyl being most preferred.

X is a $C_2$-$C_6$, preferably $C_2$-$C_4$ alkylene group, for example, ethylene, propylene, butylene, pentylene and hexylene, with ethylene being most preferred.

In formula (4), X is preferably a $C_2$-$C_4$ alkylene group, and —(Si$R^4$$R^5$—O)$_c$— is preferably a diphenylsiloxane unit having the formula (6).

[Chem. 7]

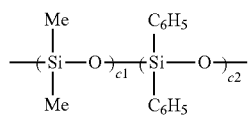

(6)

Herein c1 and c2 are integers in the range c1≥0, c2≥0, and c1+c2=c, preferably c2/c is from 0.02 to 1.0, especially from 0.05 to 0.3, and Me stands for methyl.

Exemplary are organopolysiloxanes of the following formulae.

c1 and c2 indicative of the repetition numbers of dimethylsiloxane units and diphenylsiloxane units are selected to be 0 or a positive integer so as to meet a viscosity at 25° C. of 100 to 500,000 mPa·s, especially 300 to 100,000 mPa·s.

[Component (B)]

Component (B) functions as a plasticizer for adjusting the viscosity of the composition or the hardness of a silicone gel (or gel-like cured product) obtained by curing the composition.

Component (B) is a linear or branched organopolysiloxane based on a backbone composed of repeating diorganosiloxane units and having at least two groups of the general formula (3) per molecule,

[Chem. 9]

(3)

wherein $R^1$ is a $C_2$-$C_6$ alkenyl group, $R^2$ is a $C_1$-$C_{10}$ substituted or unsubstituted monovalent hydrocarbon group, b is an integer of 1 to 3, and the broken line denotes a valence bond, preferably 2 to 6 groups, more preferably 2 or 3 groups of formula (3). Preferably it is a linear or branched organopolysiloxane blocked at some end of the molecular chain, especially at entire ends of the molecular chain with a group of formula (3).

In formula (3), suitable $C_2$-$C_6$ alkenyl groups $R^1$ include vinyl, allyl, propenyl, isopropenyl, and butenyl. Examples of the $C_1$-$C_{10}$, preferably $C_1$-$C_6$ substituted or unsubstituted monovalent hydrocarbon group $R^2$ include alkyl groups such as methyl, ethyl, propyl, isopropyl, butyl, isobutyl, tert-butyl, hexyl, octyl, and 2-ethylhexyl; cycloalkyl groups such as cyclohexyl; aryl groups such as phenyl and tolyl; aralkyl groups such as benzyl and phenylethyl; and substituted forms of the foregoing groups in which some hydrogen is substituted by halogen (e.g., chlorine, fluorine or bromine), such as trifluoropropyl. For ease of synthesis, methyl, phenyl and trifluoropropyl are preferred.

[Chem. 8]

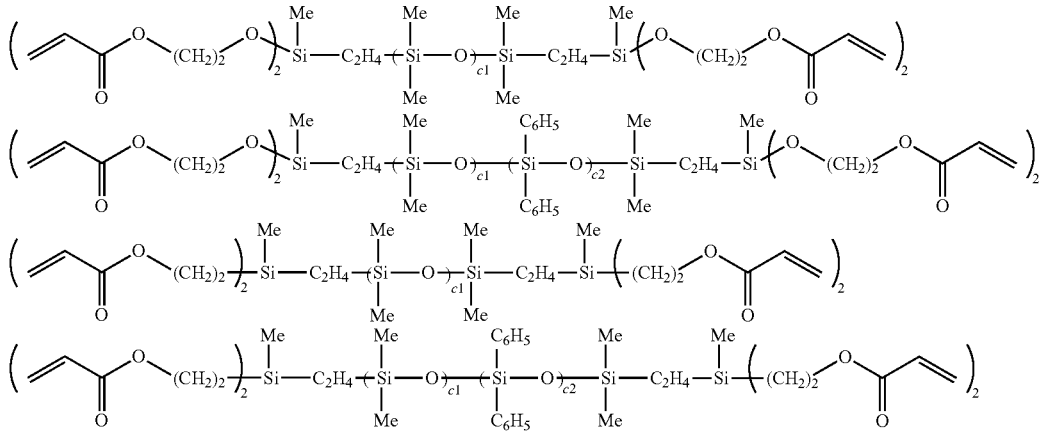

In each formula, Me stands for methyl, the repeating units of which the backbone is composed are randomly arrayed, and The molecular structure of component (B) is a linear or branched structure (inclusive of a partially branched linear structure), preferably a linear or partially branched linear structure, more preferably a linear diorganopolysiloxane which is blocked at both ends of the molecular chain with groups of formula (3), specifically (organo)alkenylsiloxy groups such as dimethylvinylsiloxy, methyldivinylsiloxy or trivinylsiloxy groups, and whose backbone is composed of repeating diorganosiloxane units of at least one type selected from diphenylsiloxane units, methylphenylsiloxane units, dimethylsiloxane units, and trifluoropropylmethylsiloxane units. Component (B) may be a homopolymer having such a molecular structure, a copolymer having such molecular structures, or a mixture of these polymers.

Component (B) should preferably have a viscosity at 25° C. in the range of 100 to 500,000 mPa·s, especially 300 to 100,000 mPa·s, within which the composition is easier to work and the cured product has better dynamic properties. In the case of linear organopolysiloxane, the above range of viscosity generally corresponds to a number average degree of polymerization of about 50 to 2,000, preferably about 100 to 1,500.

Component (B) is blended in such an amount that the weight ratio of component (A) to (B), i.e., (A)/(B) may fall in the range from 5/95 to 70/30. The hardness (or penetration) of the resulting cured product is readily controlled by adjusting the weight ratio of component (B). As the weight ratio of component (B) becomes lower, the cured product has a higher hardness (or smaller penetration). Inversely, as the weight ratio of component (B) becomes higher, the cured product has a lower hardness (or larger penetration). A weight ratio of component (B) in excess of 95 invites a substantial loss of curability, failing to obtain the desired silicone gel cured product. A weight ratio of component (B) of less than 30 results in a cured product having a high hardness rather than a silicone gel cured product having a low modulus.

[Component (C)]

Component (C) is a photoinitiator which may be any of those initiators used in conventional UV-curable organopolysiloxane compositions. Examples include acetophenone, propiophenone, benzophenone, fluorene, benzaldehyde, anthraquinone, triphenylamine, carbazole, 3-methylacetophenone, 4-methylacetophenone, 3-pentylacetophenone, 4-methoxyacetophenone, 3-bromoacetophenone, 4-allylacetophenone, p-diacetylbenzene, 3-methoxybenzophenone, 4-methylbenzophenone, 4-chlorobenzophenone, 4,4'-dimethoxybenzophenone, 2,2'-diethoxyacetophenone, 4-chloro-4'-benzylbenzophenone, 3-chloroxanthone, 3,9-dichloroxanthone, 3-chloro-8-nonylxanthone, benzoin, benzoin methyl ether, benzoin butyl ether, bis(4-dimethylaminophenyl)ketone, benzyl methoxyketal, 2-chlorothioxanthone, diethylacetophenone, 1-hydroxycyclohexyl phenyl ketone, 2-methyl-1-[4-(methylthio)phenyl]-2-morpholin-1-one, 2-benzyl-2-dimethylamino-1-(4-morpholinophenyl)butanone, 1-[4-(2-hydroxyethoxy)phenyl]-2-methyl-1-propan-1-one, 2,2-dimethoxy-2-phenylacetophenone, 2-hydroxy-2-methyl-1-phenylpropan-1-one, and cyclohexyl phenyl ketone.

The amount of component (C) blended is about 0.01 to 15 parts by weight, preferably about 0.05 to 10 parts by weight, more preferably about 0.05 to 8 parts by weight, even more preferably about 0.1 to 6 parts by weight per 100 parts by weight of components (A) and (B) combined. Differently stated, the amount of component (C) blended is desirably about 0.01 to 10% by weight, more desirably about 0.05 to 8% by weight, even more desirably about 0.1 to 5% by weight based on the total weight of the composition, especially the total weight of components (A) to (C). If the amount of component (C) is too small, its addition effect may not be exerted. If the amount of component (C) is too much, the influence of decomposition residues of component (C) becomes stronger whereby the physical properties of the cured product may be degraded.

Besides the foregoing components (A) to (C), other optional components may be added to the inventive UV-curable organopolysiloxane composition as long as the benefits of the invention are not compromised. Suitable components include silica-base fillers (not inhibiting UV cure reaction) such as fumed silica, extenders such as silicone rubber powder and calcium carbonate, tackifiers (contributing to an improvement in adhesion or pressure-sensitive adhesion) such as alkoxyorganosilanes, heat resistant additives, and flame retardants.

The inventive UV-curable organopolysiloxane composition may be prepared by mixing the predetermined amounts of components (A) to (C) and other optional components until uniform.

The inventive UV-curable organopolysiloxane composition is cured by resorting to UV exposure. Effective UV is of wavelength 250 to 450 nm, especially 250 to 380 nm, and the exposure dose is preferably 1,000 to 10,000 mJ/cm$^2$, especially 2,000 to 5,000 mJ/cm$^2$. The curing temperature may be room temperature, typically 25° C.±10° C.

The inventive UV-curable organopolysiloxane composition is effectively curable with a wide range of UV illuminance, satisfactory in surface cure and depth cure under air atmosphere, and fully resistant to oxygen inhibition.

The cured product obtained from curing of the inventive UV-curable organopolysiloxane composition is typically a silicone gel, having a penetration of 10 to 130, preferably 20 to 100, as measured according to JIS K2220 using a ¼ cone. If the penetration of the cured product is too small, the surface of the cured product (silicone gel) becomes wavy or wrinkly rather than flat. If the penetration is too large, the non-crosslinked free oil fraction can bleed out of the cured product (silicone gel) with a lapse of time. In order that the cured product have a penetration in the desired range, the organopolysiloxane composition comprising components (A) to (C) in the predetermined blend ratio is irradiated at room temperature with UV of the specific wavelength range in the predetermined dose to form a silicone gel cured product.

The cured product obtained from curing of the inventive UV-curable organopolysiloxane composition should preferably have a volume resistivity of at least 1 TΩ·m, more preferably 1 to 100 TΩ·m as measured according to JIS K6271 at an applied voltage of 500 V. If the volume resistivity of the cured product is too low, the necessary level of electric insulation to protect electronic parts may not be reached. In order that the cured product have a volume resistivity in the desired range, the organopolysiloxane composition comprising components (A) to (C) in the predetermined blend ratio is irradiated at room temperature with UV of the specific wavelength range in the predetermined dose to form a silicone gel cured product.

While the cured product or silicone gel of the inventive UV-curable organopolysiloxane composition finds a variety of applications, it is advantageously used in a portion for encapsulating the sensor body (or semiconductor chip) of a pressure sensor.

Once the cured product of the inventive UV-curable organopolysiloxane composition is potted onto the semiconductor chip (or so-called sensor chip), the sensor chip is protected from the ingress of deleterious ingredients such as dust, debris and exhausted gases from the outside.

EXAMPLES

Examples and Comparative Examples are given below by way of illustration of the invention and not by way of limitation. In Examples, "pbw" is parts by weight, and Me stands for methyl. The viscosity is measured at 25° C. by a rotational viscometer.

Component (A)

(A-1) linear dimethylpolysiloxane based on a backbone composed of repeating dimethylsiloxane units and containing 4 acryloxyethyloxy groups per molecule (two groups at each of the both ends of the molecular chain), represented by the formula (7), having a viscosity of 6,000 mPa·s

[Chem. 10]

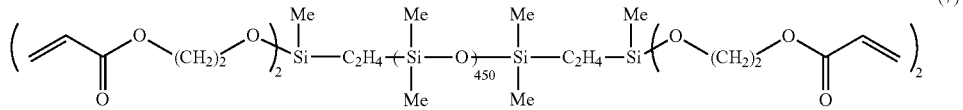

(7)

(A-2) linear diphenylsiloxane-dimethylsiloxane copolymer based on a backbone composed of repeating diphenylsiloxane units and dimethylsiloxane units and containing 4 acryloxyethyloxy groups per molecule (two groups at each of the both ends of the molecular chain), represented by the formula (8), having a viscosity of 3,000 mPa·s

[Chem. 11]

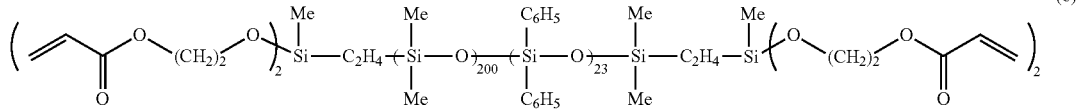

(8)

(A-3) linear polydimethylsiloxane based on a backbone composed of repeating dimethylsiloxane units and containing 2 acryloxymethyl-dimethylsilyl groups per molecule (one group at each of the both ends of the molecular chain), represented by the formula (9), having a viscosity of 5,000 mPa·s

[Chem. 12]

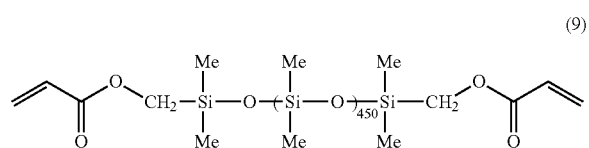

(9)

(A-4) linear organopolysiloxane based on a backbone composed of repeating diphenylsiloxane units and dimethylsiloxane units and containing 2 acryloxyethyloxy groups per molecule (one group at each of the both ends of the molecular chain), represented by the formula (10), having a viscosity of 3,000 mPa·s Component (B)

(B-1) linear dimethylpolysiloxane based on a backbone composed of repeating dimethylsiloxane units, blocked with dimethylvinylsiloxy groups at both ends of the molecular chain, and having a viscosity of 600 mPa·s (B-2) linear diphenylsiloxane-dimethylsiloxane copolymer based on a backbone composed of repeating diphenylsiloxane units and dimethylsiloxane units, blocked with dimethylvinylsiloxy groups at both ends of the molecular chain, and having a viscosity of 3,000 mPa·s (B-3) linear dimethylpolysiloxane based on a backbone composed of repeating dimethylsiloxane units, blocked with trimethylsiloxy groups at both ends of the molecular chain, and having a viscosity of 500 mPa·s Component (C)

(C-1) Darocur 1173 by BASF

Examples 1 and 2 and Comparative Examples 1 to 3

Silicone compositions S1 to S5 were prepared by combining and mixing the foregoing components (A) to (C) according to Table 1. Silicone compositions S1 to S5 were cured in air atmosphere at room temperature (25° C.) by exposure to UV of wavelength 365 nm from an Eye UV electronic control instrument (model: UBX0601-01, Eye Graphics Co., Ltd.) such that the exposure dose of UV light was 5,000 mJ/cm$^2$, obtaining specimens of 20 mm thick. The specimens were measured for penetration, volume resistivity, and surface cure, with the results shown in Table 1. Notably the penetration was measured by the test method of JIS K2220 (¼ cone). The volume resistivity was measured by the test method of JIS K6271 at an applied voltage of 500 V. The surface cure was evaluated good (○) when the cured product surface was tack-free and poor (X) when the surface was tacky or uncured oil bled out.

[Chem. 13]

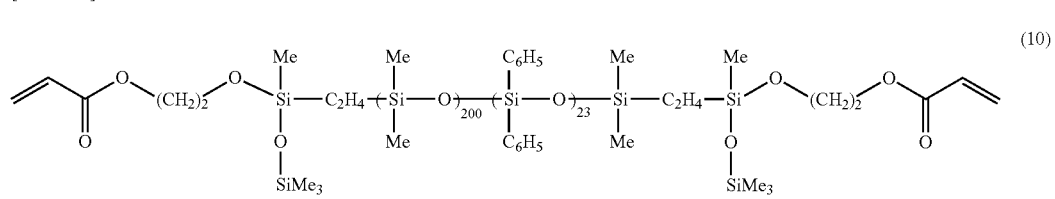

(10)

TABLE 1

|  |  | Example 1 | Example 2 | Comparative Example 1 | Comparative Example 2 | Comparative Example 3 |
|---|---|---|---|---|---|---|
| Silicone composition | | S1 | S2 | S3 | S4 | S5 |
| Amount (pbw) | (A-1) | 20 | — | — | 20 | — |
| | (A-2) | — | 14 | — | — | — |
| | (A-3) | — | — | 40 | — | — |
| | (A-4) | — | — | — | — | 100 |
| | (B-1) | 80 | — | 60 | — | — |
| | (B-2) | — | 86 | — | — | — |
| | (B-3) | — | — | — | 80 | — |
| | (C-1) | 2.0 | 2.0 | 2.0 | 2.0 | 2.0 |
| Penetration | | 68 | 70 | 60 | 70 | 80 |
| Volume resistivity (TΩ · m) | | 7.5 | 9.0 | 1.0 | 9.5 | 6.5 |
| Surface cure | | ○ | ○ | X | X | X |

As seen from the results in Table 1, the compositions of Examples 1 and 2 exhibited satisfactory surface cure even in air atmosphere.

Silicone compositions S1 to S3 were cured in different UV doses, after which penetration was measured by the same method as above. The results are shown in Table 2.

TABLE 2

| Penetration Silicone composition | | Example 1 S1 | Example 2 S2 | Comparative Example 1 S3 |
|---|---|---|---|---|
| UV dose @ 365 nm | 1,000 mJ/cm² | 69 | 72 | 92 |
| | 2,000 mJ/cm² | 68 | 70 | 75 |
| | 5,000 mJ/cm² | 68 | 70 | 60 |
| | 10,000 mJ/cm² | 67 | 68 | 53 |

The results in Table 2 demonstrate that gel-like cured products having a substantially constant penetration (substantially constant crosslinking density) are obtained from Examples 1 and 2 in a consistent manner independently of the UV exposure dose (irradiation energy amount), in stark contrast to Comparative Example 1.

The invention claimed is:

1. A UV-curable organopolysiloxane gel composition comprising:
   (A) 5 to 70 parts by weight of a linear or branched organopolysiloxane based on a backbone composed of repeating diorganosiloxane units and having at least three groups of the general formula (1) and/or (2) per molecule, as a monovalent substituent bonded to the silicon atom at the end of the molecular chain,

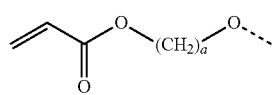

(1)

wherein "a" is an integer of 1 to 3, and the broken line denotes a valence bond,

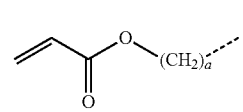

(2)

wherein "a" is as defined above, and the broken line denotes a valence bond, (B) 30 to 95 parts by weight of a linear or branched organopolysiloxane based on a backbone composed of repeating diorganosiloxane units and having at least two groups of the general formula (3) per molecule,

(3)

wherein $R^1$ is a $C_2$-$C_6$ alkenyl group, $R^2$ is a $C_1$-$C_{10}$ substituted or unsubstituted monovalent hydrocarbon group, b is an integer of 1 to 3, and the broken line denotes a valence bond, the total of components (A) and (B) being 100 parts by weight, and (C) 0.01 to 15 parts by weight of a photoinitiator.

2. The UV-curable organopolysiloxane gel composition of claim 1 wherein component (A) is a linear or branched organopolysiloxane having one or two groups of the general formula (1) and/or (2) on each of the silicon atoms at the ends of the molecular chain independently, the total number of said groups being at least three per molecule, and
   component (B) is a linear or branched organopolysiloxane blocked at the end of the molecular chain with a group of the general formula (3).

3. The UV-curable organopolysiloxane gel composition of claim 1 wherein component (A) is an organopolysiloxane having the general formula (4) and/or (5):

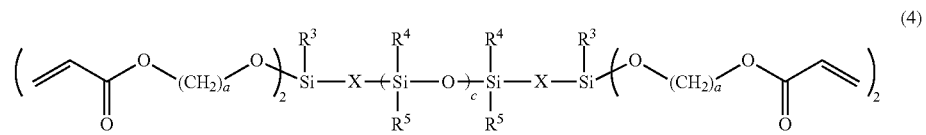

(4)

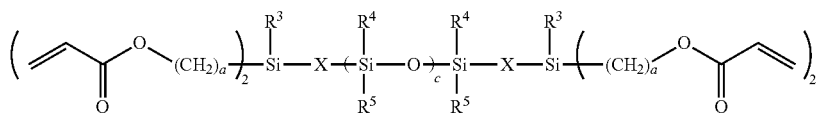

(5)

wherein "a" is an integer of 1 to 3, X is a $C_2$-$C_6$ alkylene group, $R^3$, $R^4$, and $R^5$ are each independently a $C_1$-$C_{12}$ substituted or unsubstituted monovalent hydrocarbon group, and c is such a number that the organopolysiloxane may have a viscosity of 100 to 500,000 mPa·s.

4. A method for preparing a silicone gel cured product, comprising the step of irradiating UV radiation to the UV-curable organopolysiloxane gel composition of claim 1, the cured product having a penetration of 10 to 130 according to JIS K2220.

5. A silicone gel cured product obtained by curing the UV-curable organopolysiloxane gel composition of claim 1, the cured product having a penetration of 10 to 130 according to JIS K2220 and a volume resistivity of at least 1 TΩ·m according to JIS K6271 at an applied voltage of 500 V.

6. A pressure sensor comprising the silicone gel cured product of claim 5.

7. The UV-curable organopolysiloxane gel composition of claim 1 which cures to provide the silicone gel cured product having a penetration of 10 to 130 according to JIS K2220.

8. The UV-curable organopolysiloxane gel composition of claim 1 wherein component (A) is a linear diorganopolysiloxane which is blocked at both ends of the molecular chain with groups of formula (1) and/or (2), having a number average degree of polymerization of 50 to 2,000, and component (B) is a linear diorganopolysiloxane which is blocked at both ends of the molecular chain with groups of formula (3), having a number average degree of polymerization of 50 to 2,000.

* * * * *